United States Patent [19]
Mallik et al.

[11] Patent Number: 5,116,548
[45] Date of Patent: May 26, 1992

[54] REPLICATON OF MICROSTRUCTURES BY CASTING IN CONTROLLED AREAS OF A SUBSTRATE

[75] Inventors: Donald W. Mallik, North Tarrytown; Salvatore F. D'Amato, Floral Park, both of N.Y.

[73] Assignee: American Bank Note Holographics, Inc., Elmsford, N.Y.

[21] Appl. No.: 542,916

[22] Filed: Jun. 22, 1990

Related U.S. Application Data

[62] Division of Ser. No. 399,812, Aug. 29, 1989.

[51] Int. Cl.$^5$ .................... B29D 11/00; B29D 39/10
[52] U.S. Cl. ..................... 264/1.3; 264/1.4; 264/1.6; 264/1.7; 264/106; 427/44; 427/162; 427/163; 427/258
[58] Field of Search .............. 264/1.3, 1.4, 1.7, 1.9, 264/106, 107, 1.6; 427/44, 54.1, 256, 258, 162, 163, 164

[56] References Cited

U.S. PATENT DOCUMENTS

| | | | |
|---|---|---|---|
| 3,565,978 | 2/1971 | Folger et al. | 264/1.3 |
| 3,935,334 | 1/1976 | Narui et al. | 427/81 |
| 4,242,378 | 12/1980 | Arai | 427/264 |
| 4,246,297 | 1/1981 | Nablo | 427/44 |
| 4,329,385 | 5/1982 | Banks | 264/22 |
| 4,398,994 | 8/1983 | Beckett | 156/345 |
| 4,420,502 | 12/1983 | Conley | 427/54.1 |
| 4,427,732 | 1/1984 | Gray, III et al. | 427/44 |
| 4,490,409 | 12/1984 | Nablo | 427/44 |
| 4,521,445 | 6/1985 | Nablo | 264/22 |
| 4,552,614 | 11/1985 | Beckett | 156/640 |
| 4,560,578 | 12/1985 | Freeman | 427/44 |
| 4,591,707 | 5/1986 | Stenzel et al. | 283/83 |
| 4,601,861 | 7/1986 | Pricone et al. | 264/1.9 |
| 4,610,755 | 9/1986 | Beckett | 156/345 |
| 4,685,997 | 8/1987 | Beckett | 156/629 |
| 4,728,377 | 3/1988 | Gallagher | 156/58 |
| 4,758,296 | 7/1988 | McGrew | 264/1.3 |
| 4,790,893 | 12/1988 | Watkins | 264/1.3 |
| 4,933,120 | 6/1990 | D'Amato et al. | 264/1.3 |

FOREIGN PATENT DOCUMENTS

| | | |
|---|---|---|
| 0253089 | 1/1988 | European Pat. Off. . |
| 0328086 | 8/1989 | European Pat. Off. . |
| 09252 | 12/1988 | PCT Int'l Appl. . |
| 2019257 | 10/1979 | United Kingdom . |
| 2027441 | 2/1980 | United Kingdom . |
| 213635 | 9/1984 | United Kingdom . |

OTHER PUBLICATIONS

Nabo and Tripp, "Advances in Electron Curing for High Speed Converting", 1978 Paper Synthetics Conference, Technical Association of the Pulp and Paper Industry, Sep. 25-27, 1978, pp. 117-125.

Tripp, "Recent Developments in Electron Beam Curing", presented at Radcure in Europe, May, 1987, pp. 10-9 through 10-15.

"Why Extrusion Will Challenge Injection Molding for Manufacturing Optical Disks", Plastics Technology, Nov. 1987, pp. 13, 15, 17.

Primary Examiner—James Lowe
Attorney, Agent, or Firm—Majestic, Parsons, Siebert & Hsue

[57] ABSTRACT

A method and system for replicating microstructures surface relief patterns, such as diffraction patterns including holograms, by casting. A liquid casting resin is held between a surface relief master of the microstructure to be replicated and a substrate while the resin is hardened by actinic radiation curing. Application of resin to edges and discontinuities of the master is avoided in order to reduce undesirable build-up of resin on these areas of the master. The hardened resin surface relief replica may optionally be coated with a discontinuous graphical pattern of a clear or colored paint that eliminates the effect of the surface relief pattern in the regions so coated.

20 Claims, 4 Drawing Sheets

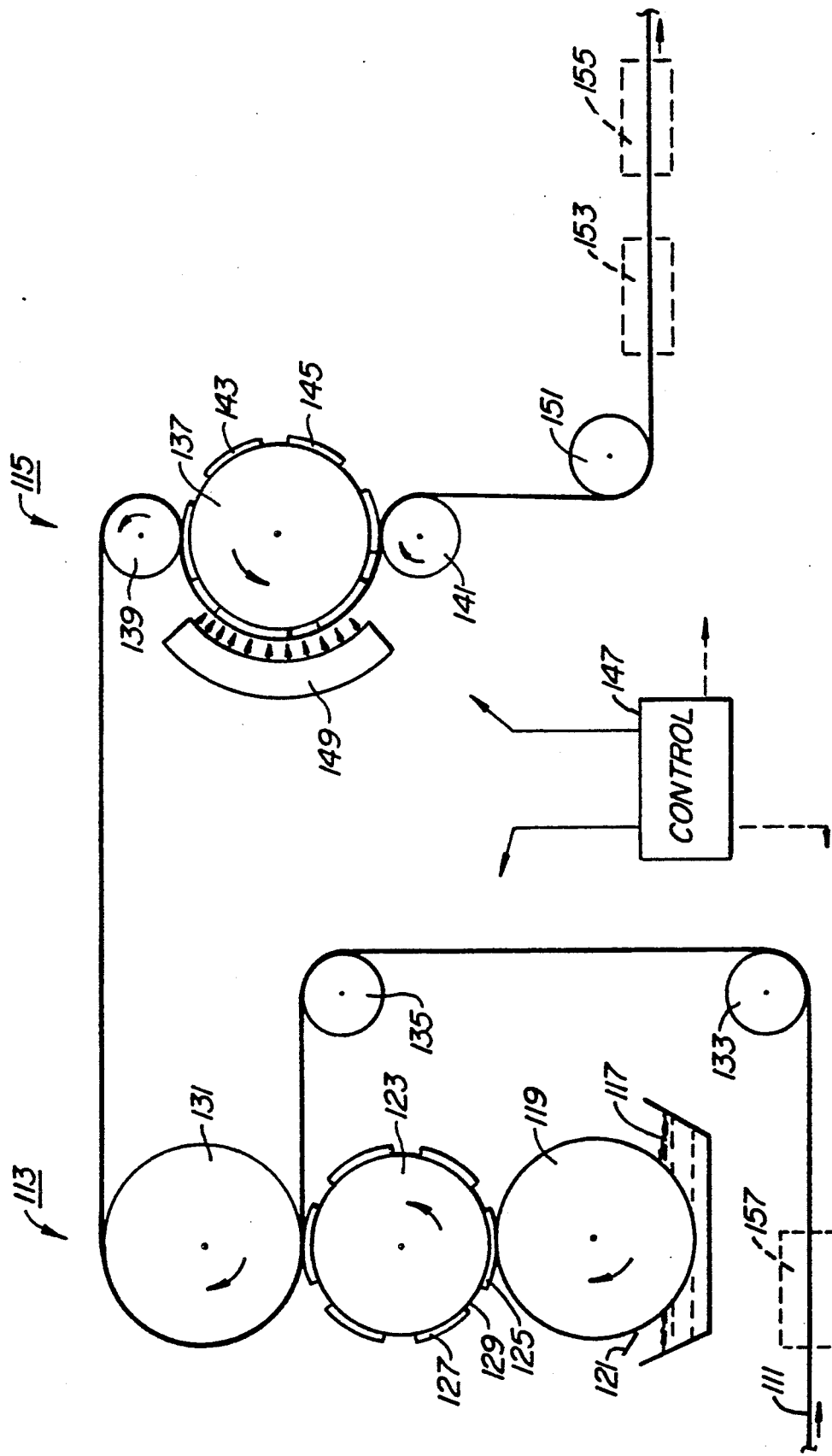
FIG._1.

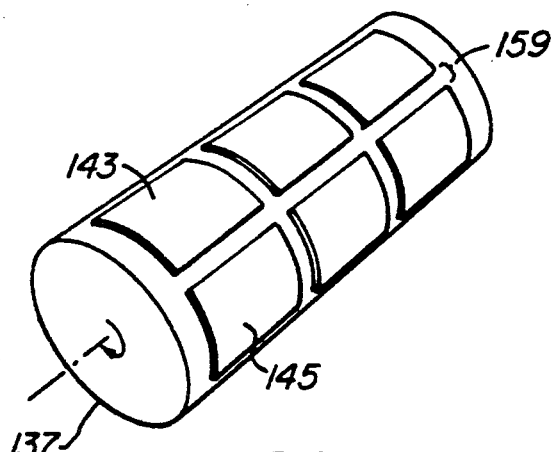
FIG._2.
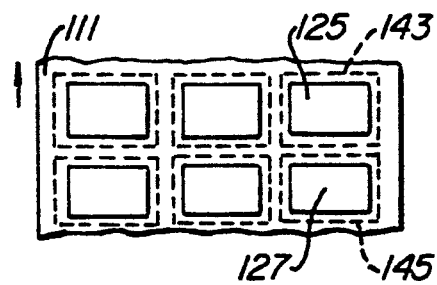
FIG._3.
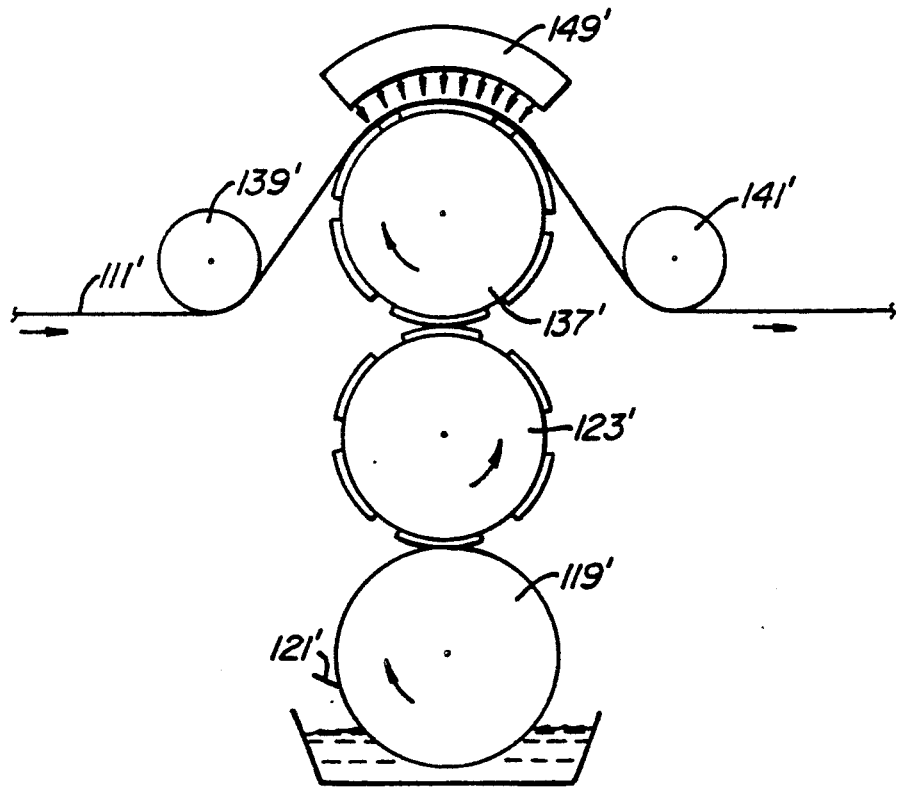
FIG._4.

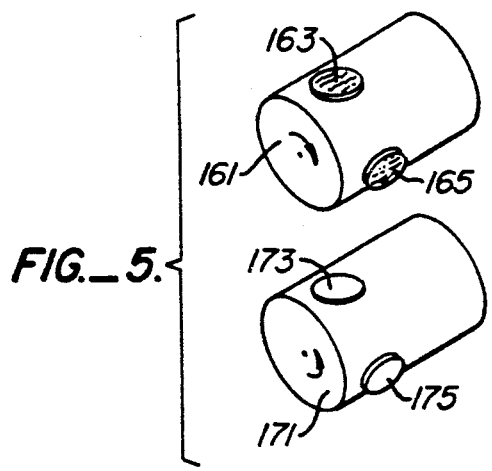
FIG._5.
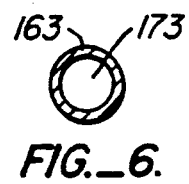
FIG._6.
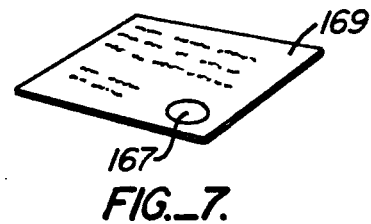
FIG._7.
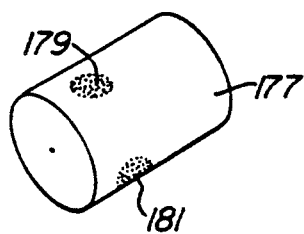
FIG._8.
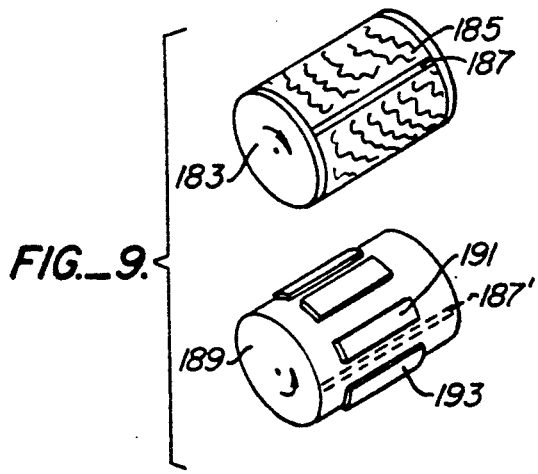
FIG._9.
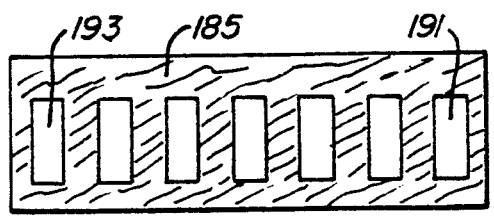
FIG._10.
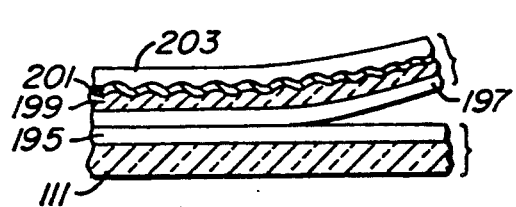
FIG._11.
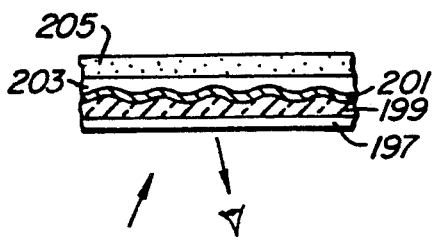
FIG._12.

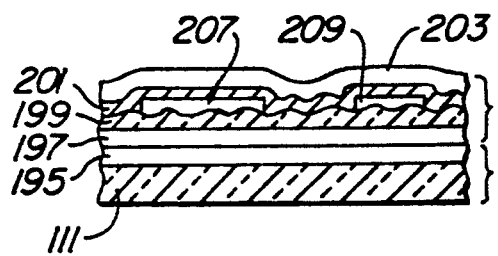
FIG.__13.
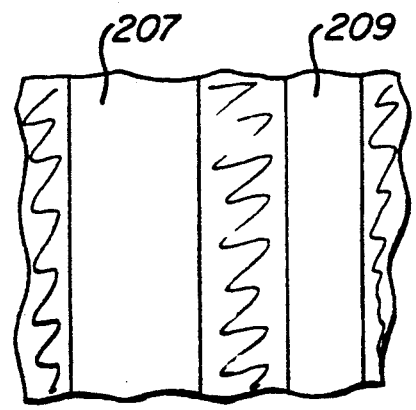
FIG.__14.

REPLICATON OF MICROSTRUCTURES BY CASTING IN CONTROLLED AREAS OF A SUBSTRATE

This is a division of application Ser. No. 07/399,812, filed Aug. 29, 1989.

BACKGROUND OF THE INVENTION

This invention relates generally to processes of forming microstructure pattern replicas on a flexible substrate by use of a mold that holds liquid resin on the substrate during curing of the resin, specifically when the microstructure is in the form of a light image carrying surface relief hologram or other light diffraction pattern.

Great Britain published patent application no. 2,027,441 provides a good background of various casting techniques for forming microstructure surface relief patterns on substrates, particularly when the microstructure forms an optical element or is holographically formed. FIG. 9 of this patent publication shows a continuous process for forming such microstructures on a continuous substrate web that is advanced over a portion of the circumference of a rotating drum without relative movement therebetween. The outside circumference of the drum holds a surface relief pattern in the form of the microstructure to be replicated, in the nature of a mold. A liquid casting resin is applied to the rotating drum surface just before it comes into contact with the substrate web. Thus, the casting material is contained between the surface relief pattern mold on the drum and the substrate web where the web and drum are in contact. The resin in this region is hardened by curing, usually by directing actinic radiation, such as ultraviolet light or an electron beam, through the substrate to the resin. When the substrate web is then separated from the drum, it contains hardened resin material on one surface. The exposed surface of the resin material then contains a replica of the microstructure of the master mold on the drum.

Such casting techniques are being applied to the mass replication of holograms for commercial purposes. As is well known, a master hologram is usually made on a photosensitive material, such as a photoresist film, that results in the holographic information being contained in a surface relief pattern. That is, the master hologram surface contains undulations across it that contain holographic information in their shape, depth, pattern and spatial frequency. A hologram pattern usually contains over 10,000 grooves (lines) per inch across its surface, more typically between 30,000 and 40,000 lines per inch. The images recorded on a hologram are reconstructed by illuminating the surface relief pattern. The illuminating light is diffracted and refracted by the surface relief pattern to reconstruct the originally recorded images.

Such a master hologram is physically delicate and cannot be directly used to mass reproduce copies. Therefore, typically, a thin metal film is electrodeposited on the master optical hologram in a manner that it faithfully follows the surface relief pattern. The metal usually used is nickel. Once the optical hologram and metal master are separated, a number of sub-masters are made from it. These submasters are then joined together in order to form a large sheet that can be wrapped around a casting drum. Casting material is then coated onto the substrate web or the drum prior to their surfaces coming into contact. The resin is hardened by curing to complete an initial formation of hologram replicas.

By using a correspondingly wide drum and substrate web, many replicas of the hologram are formed across the width of the web as well as along its length. A large number of replicas of the single hologram are produced by a single revolution of the drum. These individual holograms are then separated from the web material and applied to individual object surfaces by either a hot stamping process or simply by cutting the individual holograms from the web and adhering them to the object surfaces.

It is a primary object of the present invention to provide a casting technique for holograms or other microstructures that improves the process described above in order to make it better adapted for replicating very large numbers of holograms in a continuous process.

It is also an object of the present invention to provide a casting technique that requires only infrequent shutdowns of casting machinery for cleaning and the like.

It is another object of the present invention to provide a method and apparatus for more easily forming multiple hologram masters for attachment to a replicating drum or other continuous surface.

It is yet another object of the present invention to provide a casting technique that provides increased flexibility in how it is used and in the types of products that can be formed therefrom.

It is a further object of the present invention to provide an improved structure of a hologram or other light diffraction grating, and processes of forming such a structure.

SUMMARY OF THE INVENTION

These and additional objects are accomplished by the various aspects of the present invention, wherein, briefly, accordingly to one aspect thereof, the liquid resin coating is applied either directly to the multiple microstructure master or to the substrate web in registration with carefully defined areas of the master, in order to avoid liquid resin being applied to the edges of each microstructure master and the seams or other discontinuities between them. This avoids an undesired build-up of cured resin that can occur along such seams, edges or other discontinuities between the individual microstructure masters.

The result of these techniques is a better quality replicated web and less down time in the casting operation since cleaning of resin build-up in these regions of the master is necessary only infrequently. As importantly, the individual microstructure masters do not need to be so carefully joined together in order to make a single sheet of masters for attachment to a drum or other continuous surface, as is now being done. This is a very painstaking process, primarily because of the attention that must be given to joining the master microstructures with seams that are as smooth as possible. This often requires making additional replicas of microstructures that are joined together in order to build up a large sheet with the microstructure masters smoothly joined together. By the technique of the present invention, each individual microstructure master can be attached to the drum or other continuous surface independently of all the others since resin is not applied to its edges or to the spaces inbetween the microstructures. Preferably, however, where a large number of masters are to be fitted onto a single drum or other continuous surface, a plurality of master microstructures will be joined together and then as a unit attached to a drum or other continuous surface along with other similar plates of multiple microstructures that are all spaced apart from one another.

According to another aspect of the present invention, a unique hologram structure is formed by painting a clear or colored paint onto the cast replica microstructure surface in a graphical pattern. The paint eliminates light refraction by the microstructure in those regions covered by the paint. Thus, any optical effect of the microstructure, such as is present in a hologram or other diffraction grating, is eliminated in those regions where the paint fills in the surface relief pattern. Both the optical information of the surface relief pattern and the paint graphics may be viewed.

The casting techniques of the present invention are related to those described for holograms and other diffraction patterns in co-pending patent application Ser. No. 183,005, filed Apr. 18, 1988, now U.S. Pat. No. 4,933,120, the disclosure of which is hereby incorporated by reference herein.

Additional objects, advantages and features of the present invention will become apparent from a description of its preferred embodiments, which description should be taken in conjunction with the accompanying drawings.

BRIEF DESCRIPTION OF THE DRAWINGS

FIG. 1 illustrates a microstructure casting process according to one embodiment of the present invention;

FIG. 2 is an example of a replicating drum of the system of FIG. 1;

FIG. 3 illustrates registration of elements of the system of FIG. 1;

FIG. 4 shows a modification of the replicating system of FIG. 1, according to a second embodiment of the present invention;

FIG. 5 shows drums that can alternatively be used in the system of FIG. 1;

FIG. 6 shows the preferred registration of the elements of the drums of FIG. 5;

FIG. 7 illustrates a resulting object onto which a microstructure has been formed by the elements of FIGS. 5 and 6;

FIG. 8 illustrates a drum that is optionally used in the process of FIG. 1 for forming the article of FIG. 7;

FIG. 9 shows yet another set of drums for alternate use in the system of FIG. 1;

FIG. 10 illustrates the registration of the elements of the drums of FIG. 9;

FIG. 11 shows a cast hologram in a form for application to some other substrate;

FIG. 12 shows the hologram of FIG. 11 attached to another substrate;

FIG. 13 is a cross-section of a unique hologram structure according to another aspect of the present invention; and FIG. 14 is a front view of the hologram of FIG. 13.

DESCRIPTION OF THE PREFERRED EMBODIMENTS

The examples of the casting techniques herein are with respect to microstructures that are holograms. Of course, these same techniques are used with a wide variety of microstructures, most of which are less demanding than holograms because of the reduced spatial frequency of the surface relief patterns. One other specific microstructure that can advantageously be cast by the techniques of this invention is that of a compact disk or video disk.

Referring to FIG. 1, the casting technique will generally be described. A web 111 of flexible substrate material is drawn off a large roll (not shown) of such material and passed through the various process steps illustrated in FIG. 1. The web 111 is subjected to two primary operations, one at a station 113 and subsequently another at a station 115. The station 113 applies liquid resin to the web 111 in a carefully controlled pattern. The station 115 urges a hologram master against each area of liquid resin on the web 111 in registration with it. Of course, the process being described can work equally well with individual sheets of substrate material except that feeding sheets in proper registration is sometimes more difficult than using a continuous web.

Referring to the first station 113 of FIG. 1, a liquid bath 117 of casting resin has a first cylindrical roller 119 rotating about its axis through the liquid bath 117. The roller 119 is preferably in the form of an analox roller. That is, the roller 119 has a very large number of small holes in its otherwise very smooth cylindrical outside surface. These holes pick up liquid when passing through the bath 117, a blade 121 removing any excess liquid not retained by the holes. In the example being shown, these holes are uniformly and densely distributed over the entire surface.

A second cylindrical roller 123 contains areas of pads, such as adjoining pads 125 and 127, that rise above the otherwise smooth cylindrical surface of the drum 123. These pads are resilient and pick up on their surfaces liquid resin from the holes of the roller 119, in the nature of inking pads. Spaces between the pads, such as a space 129 between adjoining pads 125 and 127, receive no liquid resin since the drum surface in this region does not come in contact with the roller 119.

A third roller 131 in the station 113 guides the web 111 in a path to contact the pads of the roller 123 as the web passes through the station 113. It is this contact, encouraged by the rollers 131 and 123 compressing the web 111, that then transfers the liquid resin from the pads of the roller 123 to the web surface. Thus, liquid resin is applied to the web 111 in a pattern corresponding to the pattern of the pads on the roller 123. This pattern can be most anything, depending on the specific application and the form of the hologram masters, and generally will have a pattern across the cylindrical surface of the drum 123 (into the paper of FIG. 1) as well as a pattern around its circumference as shown. Various rollers 133 and 135 are provided for properly guiding the web through the station 113.

As an alternative to the two rollers 119 and 123, a single gravure cylinder may be used. This is similar to the analox roller 119 except that its holes are in a predetermined pattern. That pattern can be the same as that of the pads on the roller 123. The gravure cylinder would then replace the rollers 119 and 123 and would apply resin directly from the bath 117 to the web 111 by contacting the web.

After leaving the station 113, the web 111 is passed in contact with the outside of a cylindrical drum 137 by appropriate guide rollers 139 and 141. The drum 137 has a plurality of individual pieces of hologram masters, such as pieces 143 and 145, attached to its outside. These hologram master pieces are arranged in essentially the same pattern as the pads of the drum 123. As a result, each hologram master on the drum 137 contacts the web 111 passing around it in an area that has already been coated by one of the pads of the roller 123. Such registration is maintained by a control system 147 that controls driving motors of the roller 123 and drum 137 in accordance with techniques commonly used in the printing industry. Alternately, a registration compensator of some kind can be placed between the stations 113 and 117 in order to alter the path length of the web between the station. Such a compensation device, however, must avoid contacting the surface of the web 111 which has liquid resin coated on it.

The web and the hologram masters of the drum 137 move together without any motion between them. The liquid resin, previously applied by the station 113, is held between the hologram masters and the substrate web 111. While being so held, the liquid resin is hardened by curing with actinic radiation. A source 149 of such radiation directs it through the web 111 to the trapped liquid resin. The actinic radiation is preferably ultraviolet light or an electron beam. The electron beam has the advantage of penetrating an optically opaque substrate web 111 without significant attenuation.

Once the web is separated from the hologram masters on the outside of the drum 137, which is accomplished by the rollers 141 and 151, the web contains areas of cast hologram replicas that are separated from one another in a pattern that is similar to that of the pads on the roller 123 and the hologram masters on the drum 137. The hologram microstructure has been cast into the surface of each of these resin areas and exists on its open, exposed surface. A hologram is usually subjected to at least one further process step, as indicated generally at 153, by coating substantially the entire web 111 with a reflective metal, usually aluminum. The hologram images can then be observed in light reflected from the individual cast replicas. Another process step, indicated at 155, may include the coating of the metallized surface relief pattern with a protective, transparent layer, for some types of holograms.

There are many other specific treatment steps that can be applied to the web as part of a continuous process or separately. As indicated at 157 of FIG. 1, the web 111 can be treated in some way prior to having the hologram formed on it. One such treatment is to have ordinary printing applied. Printing can also performed on the web 111 after the hologram is formed, either before reflective metal is applied or after. There are obviously a wide variety of additional process steps that can be accomplished.

The web substrate material 111 may be very thin plastic, paper or any other appropriate material for receiving a cast hologram on the surface thereof. The web 111 can be the ultimate article to which the hologram is being applied, such as a bank note or the like. Alternatively, the substrate can be a temporary carrier that is cut into its individual holograms and then attached to the end article such as a bank note. As a further alternative, the process of FIG. 1 can be used to make a hot stamp foil where the hologram is transferred from the carrier substrate to the end article by a hot stamping process.

Referring to FIG. 2, an example of the hologram master drum 137 is shown in perspective. Attached to a smooth cylindrical surface 159 of the drum 137 are a plurality of nickel master hologram masters such as adjacent master pieces 143 and 145. As mentioned previously, each of these pieces may contain a number of individual hologram masters repeated across it. These hologram master pieces are attached to the drum surface in a spaced-apart relationship, both cylindrically around the drum and axially across the width of the drum. By registering the liquid resin with these individual hologram pieces, coating of the drum surface 159 inbetween the pieces is substantially avoided.

Referring to FIG. 3, this registration is illustrated. The separate piece of hologram master on the drum 137 is shown in dotted outline while its corresponding area of liquid resin applied by the roller 123 is shown solid. Each of the pads 125, 127 etc. of the roller 123 is made to be smaller than the area of the corresponding hologram piece on the drum 137. This is so that the edges of the master hologram pieces are not coated with liquid resin. It will be noted from FIG. 3 that the pattern of coating on the web 111, shown in solid rectangles, is well within the outline of the master hologram pieces, shown in dotted outline.

As a result, undesirable resin build-up on edges of the hologram pieces and in discontinuities between them is avoided. By not having to form the master holograms into a single sheet that extends the entire width of the drum 137 and is wrapped around it to have its ends joined, a great deal of work in preparing the hologram masters is eliminated. The single master piece is required for an effective replication process when either the entire web or the entire hologram master drum is coated with liquid resin, as has been the previous practice.

A modification of the system of FIG. 1, having the same advantages as described above with respect to FIGS. 2 and 3, is shown in FIG. 4. Instead of separate resin coating and hologram master stations 113 and 115, a single station is shown for both operations in FIG. 4, wherein elements serving the same function and/or structurally similar to those of the system of FIG. 1 are given the same reference with a prime (') added. The analox roller 119' coats the pads of the transfer roller 123', as in FIG. 1. But instead of coating the web 111 directly, the individual hologram master pieces on the outside of the drum 137' are coated by contact with the pads on the transfer roller 123'. That is, the rollers 123' and 137' are sized the same and provided with the same pattern so that the edges of the master hologram pieces are not contacted by the pads on the transfer roller 123'. In this way, undesirable coating of the edges of those master pieces is avoided. The result on the web 111' by use of the modified system of FIG. 4 is the same as described previously with respect to FIG. 3. An advantage of the system of FIG. 4 is that registration between the master hologram pieces and the liquid casting material areas is made easier but it has a disadvantage of applying more wear to the hologram masters since the inking pads contact them in the system of FIG. 4 while they do not in the system of FIG. 1.

Referring again to FIG. 1, the roller 123 and the drum 137 are preferably made of dimensions so that the outer circumference of their respective inking pads and hologram masters is the same. This is the easiest way to provide the required registration of the liquid resin areas in the hologram masters. As an alternative to using a roller or drum, a continuous, flexible belt could be employed in either case, but a rigid drum is preferred.

One specific non-hologram use of the replication techniques described with respect to FIGS. 1-4 is the mass production of audio compact discs and video discs. In each, the digital audio and/or video information is stored in the form of a surface relief pattern that is optically detected with the use of a laser. Each of the master elements 143, 145 etc. attached to the drum 137 (see FIG. 2) can be an individual round audio compact disc master, for example. Audio and video disks typically have a microstructure with a line density in excess of 10,000 lines per inch, and typically between 15,000 and 20,000 lines per inch.

Once replicated on a long web of thin, optically clear plastic material and metallized, the individual audio or video discs are cut from the web and attached to a stiff substrate with the cast and metallized side of the web facing this substrate. Printing may be accomplished on a side of the transparent substrate opposite to that upon which the casting is done. Thus, the program contents of the disc, artists, trademarks of the supplier, etc., can be pre-printed before the cast flexible disc is attached to a rigid substrate. This arrangement allows storage of a large number of cast disc replicas in a roll, to be taken out of inventory as needed and attached to rigid substrates.

As an alternative to the cast disc mounting described above, the replica can be mounted on the rigid substrate with its cast surface extending outward. In this case, the exposed metallized surface relief pattern is additionally coated with a protective layer.

Referring to FIG. 5, a hologram master drum 161 is shown to have a plurality of spaced-apart hologram masters 163 and 165. These master pieces are in a different configuration than that shown in FIG. 2 and for a particular purpose of forming replica holograms directly on the ultimate substrate, such as a hologram 167 on a paper document 169 (FIG. 7). In this case, an inking roller 171 has pads 173 and 175 spaced apart with the same pattern as the hologram master pieces. Indeed, as indicated by FIG. 6, each inking pad is smaller than its associated master hologram piece, as before. This is simply another specific application of the general technique described with respect to FIGS. 1-4. The inking pads on the roller 171 can apply liquid resin to the web or, alternately, directly to the hologram master pieces, as described previously.

In the case of the specific application illustrated in FIGS. 5-8, it is often desired that only the area of the cast hologram replica 167 be aluminized rather than the entire substrate web. This is the case where a discreet area hologram is applied directly to a bank note or some other article where metallization over its entire surface is inappropriate or undesirable. Thus, a discreet area metallization process is utilized after forming the cast hologram, such as at location 153 of FIG. 1.

There are several alternative techniques for discreet area metallization. One is to use a mask registered with the web, as described with respect to FIGS. 5 and 6 of aforementioned co-pending patent application Ser. No. 183,005, now U.S. Pat. No. 4,933,120. The masking technique avoids coating the substrate with metal material in any location except over the cast hologram replica. Two other methods of discreet area metallization are known which will coat the entire substrate with a reflective metal layer and then remove it in all areas but over the cast hologram. One of these techniques prints a mask onto the overall aluminum coating to protect the region to remain while the unmasked portions are etched away. This is described in a number of U.S. patents naming Donald Beckett as inventor. The alternative technique is to coat the substrate with a soluble coating in the areas where metal is to be removed. After metallization, water will penetrate the metal layer to the soluble material and result in the desired demetallization. This later technique is described, for example, in U.S. Pat. Nos. 3,935,334—Narui et al. (1976) and 4,242,378—Arai (1980).

In the specific example of FIGS. 5-8, where holograms are cast directly on the ultimate substrate to which they are to be attached, it is often desired that the discreet area hologram be coated with a protective layer after metallization. This step could be accomplished in the system of FIG. 1 at position 155, for example. FIG. 8 shows a gravure cylinder 177 having a smooth outer cylindrical surface except for clusters 179 and 181 of liquid retaining holes. This cluster is in a size appropriate for the desired coverage of the hologram with a protected layer and the roller 177 is operated to keep the groups of holes registered with the holograms to be coated on the substrate material.

Referring to FIGS. 9 and 10, another specific application of the techniques earlier described is given. A hologram master drum 183 has a single metal piece 185 wrapped around the drum and joined at its ends to form a seam 187. For the reasons stated before, this is generally undesirable in the case of replicating a large number of individual holograms. But there are applications where a hologram, or more generally a diffraction grating, can be uniform over a very large area and it is desirable to transfer discreet spaced-apart sections of that pattern to the substrate. Thus, an inking roller 189 has a plurality of pads on its surface, such as adjacent pads 191 and 193. Operation of the drum 193 and roller 189 is synchronized so that the seam 187 of the master falls inbetween areas on the substrate coated with liquid resin. This is indicated in dotted outline at 187' in FIG. 9. This avoids coating the seam 187, desirable to avoid build-up of resin over that seam. FIG. 10 illustrates an overlay of the registration of the hologram or diffraction grating master and the individual inking pads.

Holograms are most often formed on a substrate web 111 by hologram manufacturers and then shipped to the ultimate user in rolls for application to the ultimate substrate such as a credit card and the like. The most popular technique for transferring the hologram from the web 111 to the credit card or other ultimate substrate is by hot stamping. Hot stamping is illustrated, for example, in U.S. Pat. No. 4,728,377—Gallagher (1988).

FIG. 11 herein illustrates such a structure. Prior to casting the hologram replicas on the web 111, it is coated with a release coating 195 and then optional strip coating 197. A hologram replica 199 is then formed by casting in accordance with the techniques described earlier. A thin aluminum layer 201 is coated on the cast hologram in a manner to follow its surface relief pattern. Over the metallization layer 201 is coated an appropriate adhesive layer 203.

In the hot stamping process, the layers 197-203 are separated from the web 111 in the hot stamping process by the adhesive 195 being melted. At the same time, the adhesive 203 is caused to adhere to the credit card, document or other ultimate substrate 205, as illustrated in FIG. 12. The hologram image is then viewable in light reflected from the metallized surface relief pattern, in the manner shown in FIG. 12.

According to another aspect of the present invention, the light refracting characteristic of the hologram replica light refracting pattern is intentionally disabled in a predetermined graphical pattern across the hologram. As an example, the hot stamp foil of FIG. 11 is shown in FIG. 13 to be the same except for painted regions 207 and 209. Even if these regions are painted with optically clear material, they will be visible since they obliterate the hologram in those areas. The surface relief pattern is filled in by the stripes 207 and 209 and their material is chosen to have a refractive index of something close to that of the cast material 199. The stripes thus disable the surface relief pattern as a reflective interface since the reflective metal layer 201 is applied after the stripes 207 and 209 are formed. If the material is made to have a color, it will be even more visible. This can be used to form a graphical pattern, including ordinary printing, that is desired to be viewed simultaneously with images formed in light reflected from the hologram in regions not coated with the layer of stripes 207 and 209. For some applications, it may be useful to omit any metallization since hologram patterns can be visible in reflection without a metal layer.

Although the various aspects of the present invention have been described with respect to its preferred embodiments, it will be understood that the invention is entitled to protection within the full scope of the appended claims.

It is claimed:

1. A method of continuously casting multiple replicas of a surface relief microstructure onto an elongated flexible substrate, comprising the steps of:
    positioning a plurality of surface relief masters of said microstructures spaced apart along a continuous support structure,
    moving the continuous support structure and the elongated substrate together through a processing station,
    in the processing station, holding liquid casting resin between the substrate and the master surface relief microstructures in an area that is less than that of said master surface relief microstructures, whereby casting resin is confined to areas of the substrate smaller than the areas of the master surface relief microstructures and which are substantially surrounded by regions without any resin held thereagainst,
    curing said resin while being held between the substrate material and the surface relief master without relative movement therebetween, thereby to substantially harden the resin in attachment with said substrate material, and
    separating said surface relief master from the hardened resin and substrate material as the continuous support structure and substrate leave the processing station, thereby to retain the hardened resin in place on said substrate material with the surface relief microstructure of said master contained in a surface thereof.

2. A method according to claim 1 wherein said continuous support structure includes an outside substantially cylindrical surface.

3. A method according to claim 2 wherein the step of positioning a plurality of surface relief masters includes positioning a plurality of said masters in spaced apart relation across a width of said cylindrical surface as well as in a direction around a circumference thereof.

4. A method of casting multiple replicas onto an elongated flexible substrate of a surface relief microstructure of a given area and which contains a discontinuity, comprising the steps of:
    holding liquid casting resin between the substrate and the master surface relief microstructure in an area that is less than the given area of said master surface relief microstructure and which avoids the discontinuity thereof, whereby casting resin is confined to areas of the substrate smaller than the areas of the master surface relief microstructure,
    curing said resin while being held between the substrate material and the surface relief master without relative movement therebetween, thereby to substantially harden the resin in attachment with said substrate material, and
    separating said surface relief master from the hardened resin and substrate material, thereby to retain the hardened resin in place on said substrate material with the surface relief microstructure of said master contained in a surface thereof.

5. A method according to either of claims 1 or 4 wherein the step of holding liquid resin includes the steps of initially applying the liquid resin to said substrate area and then bringing said master surface relief microstructures into contact with the substrate in registration with the resin.

6. A method according to either of claims 1 or 4 wherein the step of holding liquid resin includes the steps of initially applying the liquid resin to said surface relief microstructure master in a manner to substantially avoid coating the edges thereof.

7. A method according to either of claims 1 or 4 wherein the step of holding liquid resin includes the steps of initially applying the liquid resin to either the substrate or the surface relief microstructure master by use of a liquid transfer roll that carries liquid resin on its surface in said casting resin area and substantially no resin on said roll substantially around said area.

8. A method of continuously casting multiple replicas of a surface relief microstructure onto an elongated flexible substrate, comprising the steps of:
    attaching a plurality of surface relief masters of said microstructure in a first pattern across a substantially smooth continuous surface,
    coating a casting resin on said substrate in a plurality of area smaller than areas of said masters corresponding to said areas and arranged in a second pattern substantially corresponding to the first pattern,
    contacting the coated substrate and the surface relief masters in a manner that their said first and second patterns are registered with each other,
    curing said resin while being held between the substrate material and the surface relief masters without relative movement therebetween, thereby to substantially harden the resin in attachment with said substrate material, and
    separating said surface relief masters from the hardened resin and substrate material, thereby to retain the hardened resin in place on said substrate material with the surface relief microstructure of said masters contained in a surface thereof.

9. A method of continuously casting multiple replicas of a surface relief microstructure onto an elongated flexible substrate, comprising the steps of:
    attaching a plurality of surface relief masters of said microstructure in a first pattern across a substantially smooth continuous surface,
    coating a casting resin on said surface relief masters in a second pattern substantially corresponding to the first pattern and having areas smaller than corresponding areas of the masters, contacting the substrate and the coated surface relief masters, curing said resin while being held between the substrate material and the surface relief masters without relative movement therebetween, thereby to substantially harden the resin in attachment with said substrate material, and separating said surface relief masters from the hardened resin and substrate material, thereby to retain the hardened resin in place on said substrate material with the surface relief microstructure of said masters contained in a surface thereof.

10. A method according to either of claims 8 or 9 wherein the coating step includes the use of a liquid transfer roll that carries liquid resin on its surface substantially in said second pattern and substantially no resin in regions of said roll outside of said second pattern.

11. A method according to either of claims 8 or 9 wherein the coating step includes substantially avoiding contact of edges of the first pattern with liquid resin.

12. A method according to any one of claims 1, 4, 8 and 9, wherein said substrate includes a layer of release material over which the liquid resin is applied.

13. A method according to any one of claims 1-4, which additionally comprises the steps of applying to the cured resin surface relief pattern a graphical pattern of a liquid material of approximately the same refractive index as said cured resin, and curing the liquid printing material by drying, thereby substantially eliminating said microstructure in the graphical pattern.

14. A method according to any one of claims 1, 4, 8 and 9, which additionally comprises the steps of applying to the cured resin surface relief microstructure a graphical pattern of a liquid material of approximately the same refractive index as said cured resin, curing the liquid printing material by drying, thereby substantially eliminating said microstructure in the graphical pattern, and coating a light reflective material substantially only on the cured resin areas of said substrate over both the surface relief and the painted graphical pattern, whereby said microstructure and said graphical pattern are viewable through said cured resin.

15. A method according to any one of claims 1, 4, 8 and 9, which additionally comprises the step of forming a light reflective material coating substantially only on the cured resin areas of said substrate in a manner to follow its surface relief microstructure.

16. A method according to any one of claims 1, 4, 8 and 9, which additionally comprises the steps of forming a light reflective material coating substantially only on the cured resin areas of said substrate in a manner to follow its surface relief microstructure, and applying a substantially transparent overcoating to substantially only an area of the reflective coated microstructure.

17. A method according to any one of claims 1, 4, 8 and 9, wherein said surface relief microstructure includes a light diffraction pattern.

18. A method according to any one of claims 1, 4, 8 and 9, wherein said surface relief microstructure includes a hologram.

19. A method according to any one of claims 3, 4, 8 and 9, wherein said surface relief microstructure includes video or audio information.

20. A method according to any one of claims 1, 4, 8 and 9, wherein the step of curing the resin includes the step of directing electron beam energy through said substrate and into said resin.

* * * * *

UNITED STATES PATENT AND TRADEMARK OFFICE
CERTIFICATE OF CORRECTION

PATENT NO. : 5,116,548
DATED : May 26, 1992
INVENTOR(S) : DONALD W. MALLIK

It is certified that error appears in the above-identified patent and that said Letters Patent is hereby corrected as shown below:

Column 11, line 25, in Claim 13     replace "1-4"
                                    with ---1,4,8 and 9---

Column 12, line 28, in Claim 19     replace "3"
                                    with ---1---

Signed and Sealed this

Thirty-first Day of August, 1993

Attest:

BRUCE LEHMAN

*Attesting Officer*     *Commissioner of Patents and Trademarks*